July 13, 1965 T. F. OLSON 3,194,080

DRIVE SYSTEM

Filed Aug. 25, 1964

Inventor
THOR F. OLSON
By Nicholas A. Camasto
Atty.

United States Patent Office 3,194,080
Patented July 13, 1965

3,194,080
DRIVE SYSTEM

Thor F. Olson, Villa Park, Ill., assignor to Admiral Corporation, Chicago, Ill., a corporation of Delaware Filed Aug. 25, 1964, Ser. No. 391,910
9 Claims. (Cl. 74—10.7)

This invention relates to drive systems and, more particularly, to drive systems wherein a string or belt is used to translate movement of a driving member into movement of a driven member. The invention will be described in the environment of a radio receiver, and, more specifically, will be described as the drive system associated with the tuning element of a radio receiver. This embodiment has been chosen merely to aid in the description of the invention, and should not be interpreted as a limitation thereof.

The tuning element of a radio receiver is usually a variable capacitor or inductor, and is adjustable to select a specific broadcast frequency from among the spectrum of frequencies available to the receiver. In the specifically disclosed embodiment, the movable member of a variable capacitor is driven by a rotatable shaft. A tuning knob is located at a distance from this rotatable shaft (hereafter referred to as the tuner element drive shaft) and string or belt means are used to translate the rotational motion of the tuning knob to the tuner element drive shaft. The radio is tunable to only a selected band of frequencies, this band being defined, in part, by the physical limits or extremes of the movable member's adjustability.

A faceplate, with inscriptions thereon indicating the aforementioned band of frequencies, is positioned within the receiver. A pointer, affixed to the belt and movable therewith in correspondence with the movement of the tuner element drive shaft, indicates the particular frequency to which the receiver is tuned. For this reason it is necessary that the belt move only when the movable member is moved, and not yield to any continued urging of the tuning knob after the movable member has reached a limit.

It is also desirable that the tension in the belt not be critical, that is, that the system be operable whether the belt be, relatively speaking, loose or tight. In practice, a relatively loose fitting belt is preferred, as this diminishes the frictional forces present and increases the useable lifetime of the belt.

The invention discloses a drive system wherein a belt engages both a shaft connected to the tuner knob (hereafter referred to as the tuning drive shaft) and the tuner element drive shaft, the tuning drive shaft being threaded to enhance the frictional contact between the belt and the shaft.

The primary object of the invention, therefore, is to provide an improved drive system for the tuning assembly of radio apparatus.

Another object of the invention is to provide a drive system for the tuning assembly of radio apparatus with a drive shaft having extremely low and high friction areas to allow slippage when the movable member of the tuning element reaches either of its limits, and a positive drive when the movable member is between its limits.

A further object of the invention is to provide a novel drive system for the tuning assembly of radio aparatus which will maintain an exact correlation between the configuration of its tuning capacitor and the position of a pointer relative to its dial face.

A further object of the invention is to provide a belt drive system wherein the belt tension is relatively slight, thereby maximizing the useful life of the belt.

A feature of the invention lies in the provision of a belt drive system, the driven member of which includes a threaded portion with nonuniform major and minor diameters intermediate a pair of smooth portions.

A further feature of the invention lies in the provision of a threaded drive shaft with a nonuniform tooth height.

Other objects and features of the invention will be readily apparent to those skilled in the art upon reading the specification in conjunction with the drawing in which.

Figure 4:
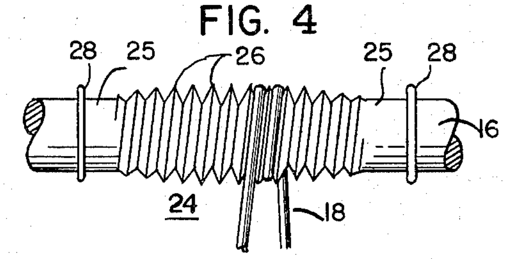
Figure 5:
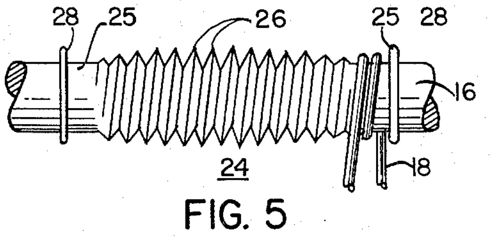

FIGURE 4 depicts a segment of a drive shaft constructed in accordance with the invention showing the position of the belt when the movable member of the tuning element is in a position intermediate its terminal positions; and FIGURE 5 depicts a segment of a drive shaft constructed in accordance with the invention showing the position of the belt when the movable member of the tuning element is at one of its terminal positions.

Figure 1:
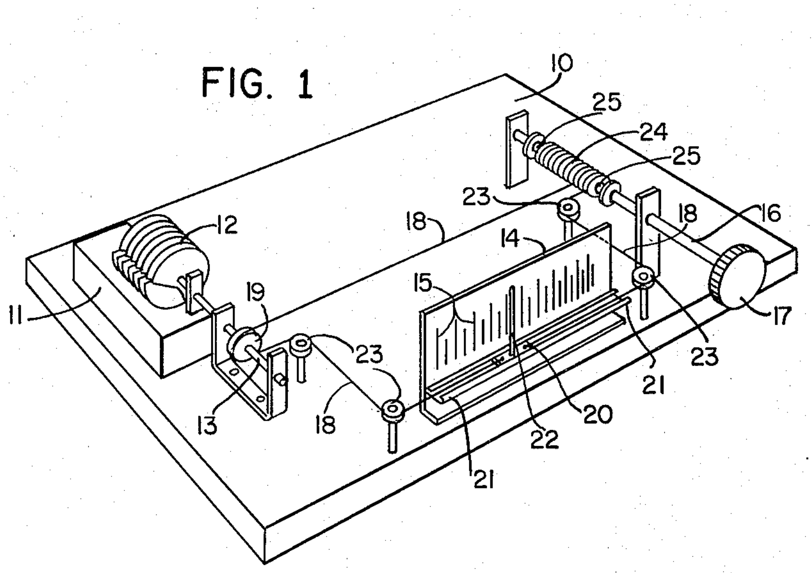
FIGURE 1 depicts a radio receiver chassis showing only a tuning assembly drive system constructed in accordance with the invention.

Referring now to FIGURE 1, a radio receiver chassis 10 has a variable capacitor 11 mounted thereon for tuning the receiver to a particular one of a predetermined plurality of frequencies. The particular frequency to which the receiver is tuned is determined by the position of a movable member 12 relative to the body of variable capacitor 11, and is selected by rotating a tuner element drive shaft 13 affixed to movable member 12. The range of said plurality of frequencies is determined, in part, by the extremities or physical limits of the movable member's adjustability. Movable member 12 is provided with stops, to define first and second terminal positions which correspond to the aforementioned physical limits. Other tuning means, such as a variable inductor, could also be used to effect this tuning, but this discussion shall be limited to a receiver tunable with a variable capacitor.

A dial face 14 with inscriptions 15 indicating said plurality of frequencies is also mounted on chassis 10. A tuning drive shaft 16 with a tuning knob 17 affixed thereto is rotated by the operator of the receiver to select a particular frequency. A soft deformable string 18 is wound about tuning drive shaft 16 and about a pulley 19 mounted on tuning drive shaft 13. This thread translates the rotational motion of tuning drive shaft 16 to tuner element drive shaft 13. The diameter of pulley 19 is usually larger than the diameter of tuning drive shaft 16. The ratio of the angular displacement of pulley 19 to the angular displacement of drive shaft 16 is thereby made small enough to insure fine tuning of the receiver.

A carriage 20 is coupled to string 18 for movement therewith and is moved parallel to dial face 14 as string 18 drives tuner element drive shaft 13. Inscriptions 15 are spaced such that a pointer 22 mounted on carriage 20 indicates the patricular frequency to which the receiver is tuned as variable capacitor 11 assumes various configurations.

Guide pulleys 23 guide string 18 onto and off of pulley 19 and tuning drive shaft 16. String 18 engages either a threaded portion 24 or one of a pair of smooth portions 25 of tuning drive shaft 16, or both, in a manner which will soon be described.

Figure 2:
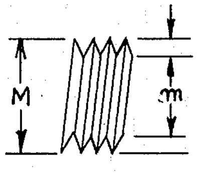
FIGURE 2 shows a labelled segment of ordinary screw thread to help define the terminology used in the specification.

FIGURE 2, showing a portion of an ordinary screw thread will aid in making clear the terminology of the specification. In FIGURE 2, "M" designates the major diameter of the screw, "*m*" represents the minor diameter of the screw and "$h$" represents the tooth height of the screw.

Figure 3:
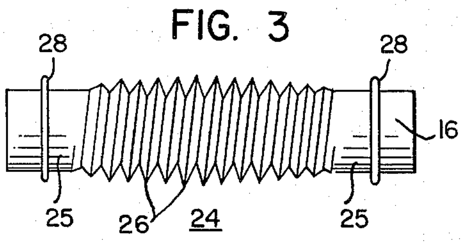
FIGURE 3 shows a drive shaft constructed in accordance with the invention.

FIGURE 3 depicts a drive shaft constructed in accordance with the invention. The drive shaft comprises a threaded portion 24 with a plurality of adjacent teeth 26, intermediate a pair of smooth portions 25. The drive shaft is threaded to offer the greatest possible surface area to string 18. String 18, being deformable, assumes the wedge shape defined by the valley between any two adjacent teeth 26 and, consequently, has approximately two-thirds of its circumference in frictional engagement with drive shaft 16. This increased friction provides a much more positive drive between the shaft and the string. When string 18 engages either of smooth portions 25, the substantial decrease in surface area contacted by string 18 results in much less friction between the string and drive shaft, and permits slippage therebetween.

Drive shaft 16 is threaded such that the tooth height of threaded portion 24, and the difference between its major and minor diameters, both approach zero as teeth 26 approach smooth portion 25. At this point the major and minor diameters are both substantially equal to the diameter of smooth portion 25. This allows string 18 to walk onto and off of smooth portion 25 without moving across any sharp edges. The useful life of the string is thereby substantially increased, due to the absence of undue stresses on the string as it moves between threaded portion 24 and smooth portion 25.

FIGURE 4 shows string 18 engaged in threaded portion 24 of drive shaft 16, as it would be if movable member 12 were in a position intermediate its terminal positions. As drive shaft 16 is rotated in either direction, string 18 is carried in that direction due to the friction between it and the sides of teeth 26, thereby translating rotational motion to tuner element drive shaft 13 and, consequently, to movable member 12. As string 18 translates this motion it also sweeps pointer 22 across dial face 14.

The number of teeth in threaded portion 24 is equal to the number of revolutions of drive shaft 16 necessary to move movable member 12 from one to the other of its terminal positions, minus one less than the number of times string 18 is wrapped about drive shaft 16. Therefore, when movable element 12 is stopped in one of its terminal positions, string 18 has advanced completely onto smooth portion 25 of tuning drive shaft 16, as is shown in FIGURE 5. Due to the decreased friction between belt 18 and drive shaft 16, further rotation (in the same direction) of drive shaft 16 merely results in slippage between string 18 and smooth portion 25. There is then, in effect, a clutching action which prevents string 18 from driving when movable member 12 is stopped.

Flanges 28 define the width of smooth portion 25 and are positioned at a distance from threaded portion 24 equal to the product of the width of string 18 and the number of wraps of string 18 about drive shaft 16. Consequently, when string 18 is completely upon smooth portion 25, it has its first wrap immediately adjacent the start of threaded segment 24. When tuning drive shaft 16 is rotated in the opposite direction, such that movable member 12 can move from the aforementioned one terminal position towards its other terminal position, string 18 will walk into engagement with threaded portion 24, again sweeping pointer 22 across dial face 14 as string 18 travels across threads 26. The slippage of string 18 when movable member 12 is stopped insures that pointer 22 will move across dial face 14 only when movable member 12 is moved relative to the body of variable capacitor 11. As has been stated, dial face 14 is calibrated such that the position of pointer 22 indicates the particular frequency to which the receiver is tuned, so long as pointer 22 is moved in correspondence with movable member 12.

What has been described is a novel belt drive system with a drive shaft which provides a positive drive between the belt and the shaft in its center region, and slippage between the belt and the shaft at both ends. While the invention has been described in the environment of a radio receiver tuning assembly, various modifications may be made by those skilled in the art without departing from the true spirit and scope of the invention. It is understood that the invention is to be limited only by the appended claims.

The embodiments of the invention in which a specific property or privilege is claimed are defined as follows:

1. A drive system comprising: driven means having a first and a second terminal position and a continuum of positions intermediate said first and second terminal positions; driving means including a drive shaft with a threaded segment intermediate a pair of smooth segments; and belt means coupled between said driven means and said driving means, the frictional force between said belt means and said threaded segment being substantially greater than the frictional force between said belt means and said smooth segments, said belt means engaging one or the other of said smooth segments when said driven means is at said first or said second terminal position and engaging said threaded segment when said driven means traverses said continuum of positions.

2. A drive system as claimed in claim 1 wherein said threaded segment includes a plurality of adjacent teeth, defining valleys therebetween, and said belt means comprise a soft deformable thread which assumes an essentially wedge shaped configuration defined by the valley between any two of said plurality of adjacent teeth when said soft deformable thread engages said threaded segment.

3. A drive system comprising: driven means having a first and a second terminal position and a continuum of positions intermediate said first and second terminal positions; driving means including a drive shaft with a threaded segment intermediate a pair of smooth segments; and belt means coupled between said driven means and said driving means, said belt means being wrapped at least once around said drive shaft, the frictional force between said belt means and said threaded segment being substantially greater than the frictional force between said belt means and said smooth segments, said belt means engaging one or the other of said smooth segments when said driven means is at said first or said second terminal position and engaging said threaded segment when said driven means traverses said continuum of positions.

4. A drive system comprising: driven means having a first and a second terminal position and a continuum of positions intermediate said first and second terminal positions; driving means including a drive shaft with a threaded segment intermediate a pair of smooth segments; and belt means coupled between said driven means and said driving means, said belt means being wrapped at least once around said drive shaft, the width of said smooth portions being at least equal to the product of the number of wraps of said belt means about said drive shaft and the width of said belt means, the number of teeth in said threaded section being substantially equal to the number of revolutions of said drive shaft necessary to move said driven means from said first to said second terminal position minus one less than the number of times said belt means is wrapped about said drive shaft, the frictional force between said belt means and said threaded segment being substantially greater than the frictional force between said belt means and said smooth segments, said belt means engaging one or the other of said smooth segments when said driven means is at said first or said second terminal position and engaging said threaded segment when said driven means traverses said continuum of positions.

5. A drive system comprising: driven means having a first and a second terminal position and a continuum of positions intermediate said first and said second terminal positions; driving means including a drive shaft with a threaded segment intermediate a pair of smooth segments, said threaded segment having a plurality of adjacent teeth, the tooth height of which approaches zero at its extremities, said threaded segment having a minor diameter approximating the diameter of said smooth segments at said extremities; and belt means coupled between said driven means and said driving means, the frictional force between said belt means and said threaded segment being substantially greater than the frictional force between said belt means and said smooth segments, said belt means engaging one or the other of said smooth segments when said driven means is at said first or said second terminal position and engaging said threaded segment when said driven means traverses said continuum of position.

6. A drive system comprising: driven means having a first and a second terminal position and a continuum of positions intermediate said first and second terminal positions; driving means including a drive shaft with a threaded segment intermediate a pair of smooth segments, the difference between the minor diameter and the major diameter of said threaded segment approaching zero at the extremities of said threaded segment, said major and minor diameters approaching the diameter of said smooth segments at said extremities; and belt means coupled between said driven means and said driving means, the frictional force between said belt means and said threaded segment being substantially greater than the frictional force between said belt means and said smooth segments, said belt means engaging one or the other of said smooth segments when said driven means is at said first or said second terminal position and engaging said threaded segment when said driven means traverses said continuum of positions.

7. In radio apparatus: an adjustable tuning element having a first and a second terminal position and a continuum of intermediate positions for tuning said radio apparatus to any one of a predetermined plurality of wavelengths; a dial face with inscriptions indicating said wavelengths; a carriage having a pointer; a drive system for adjusting said tuning element including; a first drive shaft coupled to said tuning element, a second drive shaft having a tuning knob coupled thereto, belt means coupled between said first and said second drive shafts, said carriage affixed to said belt means and movable therewith, and means including said second drive shaft insuring that a predetermined relationship is maintained between said pointer, said dial face and said tuning element; said means comprising a threaded segment on said second drive shaft intermediate a pair of smooth segments, the frictional force between said belt means and said threaded segment being substantially greater than the frictional force between said belt means and said smooth segments, said belt means engaging one or the other of said smooth segments when said tuning element is at said first or said second terminal position and engaging said threaded segment when said tuning element traverses said continuum of positions.

8. In a radio receiver: an adjustable tuning element having first and second terminal positions defined, respectively, by first and second stops, and a continuum of intermediate positions for tuning said radio receiver to any one of a predetermined plurality of wavelengths; a dial face with inscriptions indicating said wavelengths; a pointer adjacent said dial face; a drive system for adjusting said tuning element including; a first drive shaft coupled to said tuning element, a second drive shaft, a soft deformable string coupled between said first and said second drive shafts, said pointer affixed to said string; and means including said second drive shaft insuring that a predetermined relationship is maintained between said pointer, said dial face and said tuning element; said means comprising a threaded segment on said second drive shaft intermediate a pair of smooth segments, said threaded segment including a plurality of adjacent teeth, the tooth height of which approaches zero at its extremities, said threaded segment having a minor diameter approximating the diameter of said smooth segments at said extremities, said string assuming an essentially wedge shaped configuration defined by the valley between any two of said plurality of adjacent teeth when said soft deformable thread engages said threaded segment; whereby the frictional force between said string and said threaded segment is substantially greater than the frictional force between said string and said smooth segments, said string engaging one or the other of said smooth segments when said tuning element is at said first or said second terminal position, rotation of said second drive shaft to urge said tuning element past said first or second stop resulting in slippage between said string and said second drive shaft, said string engaging said threaded segment and providing a positive drive between said string and said second drive shaft when said tuning element traverses said continuum of positions.

9. In a radio receiver: an adjustable tuning capacitor having first and second terminal positions defined, respectively, by first and second stops, and a continuum of intermediate positions for tuning said radio receiver to any one of a predetermined plurality of wavelengths; a dial face with inscriptions indicating said wavelengths; a carriage having a pointer affixed thereto such that said pointer lies adjacent said dial face; a drive system for adjusting said tuning capacitor including; a driven shaft coupled to said tuning capacitor, a drive shaft, a soft deformable string coupled between said drive shaft and said driven shaft and wrapped at least once about said drive shaft, said carriage affixed to said string; and means insuring that an exact correlation is maintained between the configuration of said tuning capacitor, and the position of said pointer relative to said dial face, said means comprising a threaded segment intermediate a pair of smooth segments, the width of each of said smooth segments being defined by the distance between the first tooth of said threaded segment and an outwardly extending flange formed on the circumference of each of said smooth segments, said width being substantially equal to the product of the number of wraps of said string about said drive shaft and the width of said string, the number of teeth in said threaded segment being substantially equal to the number of revolutions of said drive shaft necessary to move said tuning capacitor from said first to said second terminal position minus one less than the number of times said string is wrapped about said drive shaft, the difference between the major and minor diameters of said threaded segment approaching zero at its extremities, said major and minor diameters being substantially equal to the diameter of said smooth segment at said extremities, said string assuming an essentially wedge shaped configuration defined by the valley between any two adjacent teeth when said string engages said threaded segment; whereby the frictional force between said string and said threaded segment is substantially greater than the frictional force between said string and said smooth segments, said string engaging one of said smooth segments when said tuning capacitor is at said first terminal position and the other of said smooth segments when said tuning capacitor is at said second terminal position, rotation of said drive shaft to urge said tuning capacitor past said first or second stop resulting in slippage between said string and said drive shaft, said string engaging said threaded segment and providing a positive drive between said string and said drive shaft when said tuning capacitor traverses said continuum of positions.

References Cited by the Examiner

UNITED STATES PATENTS 2,645,943 7/53 Mendelson ____________ 74—10.7

FOREIGN PATENTS 942,040 4/56 Germany.

MILTON KAUFMAN, *Primary Examiner.*